(12) United States Patent
Satya et al.

(10) Patent No.: US 6,751,519 B1
(45) Date of Patent: Jun. 15, 2004

(54) METHODS AND SYSTEMS FOR PREDICTING IC CHIP YIELD

(75) Inventors: Akella V. S. Satya, Milpitas, CA (US); Li Song, Fremont, CA (US); Robert Thomas Long, Santa Cruz, CA (US); Kurt H. Weiner, San Jose, CA (US)

(73) Assignee: KLA-Tencor Technologies Corporation, San Jose, CA (US)

( * ) Notice: Subject to any disclaimer, the term of this patent is extended or adjusted under 35 U.S.C. 154(b) by 0 days.

(21) Appl. No.: 10/281,433

(22) Filed: Oct. 24, 2002

Related U.S. Application Data

(60) Provisional application No. 60/338,348, filed on Dec. 5, 2001, and provisional application No. 60/346,074, filed on Oct. 25, 2001.

(51) Int. Cl.[7] .............................................. G06F 19/00
(52) U.S. Cl. ...................... 700/121; 700/109; 702/182
(58) Field of Search .................... 700/121, 108–110, 700/117; 702/182–184

(56) References Cited

U.S. PATENT DOCUMENTS

| | | | | |
|---|---|---|---|---|
| 3,751,647 A | * | 8/1973 | Maeder et al. | 713/401 |
| 6,061,640 A | * | 5/2000 | Tanaka et al. | 702/81 |
| 6,393,602 B1 | * | 5/2002 | Atchison et al. | 716/4 |
| 6,449,749 B1 | * | 9/2002 | Stine | 716/4 |
| 6,539,272 B1 | * | 3/2003 | Ono et al. | 700/110 |

\* cited by examiner

*Primary Examiner*—Leo Picard
*Assistant Examiner*—Zoila Cabrera
(74) *Attorney, Agent, or Firm*—Beyer, Weaver & Thomas, LLP.

(57) ABSTRACT

Disclosed are methods and apparatus for efficiently managing IC chip yield learning. In general terms, as each wafer lot moves through fabrication, yield information is obtained from each set of test structures for a particular process or defect mechanism. The nature of the yield information is such that it may be used directly or indirectly to predict product wafer test yield. In one implementation, the yield information includes a systematic yield ($Y_0$), a defect density (DD), and a defect clustering factor ($\alpha$) determined based on the inspected test structure's yield. A running average of the yield information for each process or defect mechanism is maintained as each wafer lot is processed. As a particular wafer lot moves through the various processes, a product wafer-sort test yield may be predicted at any stage in the fabrication process based on the running-average yield information maintained for previously fabricated wafer lots.

33 Claims, 7 Drawing Sheets

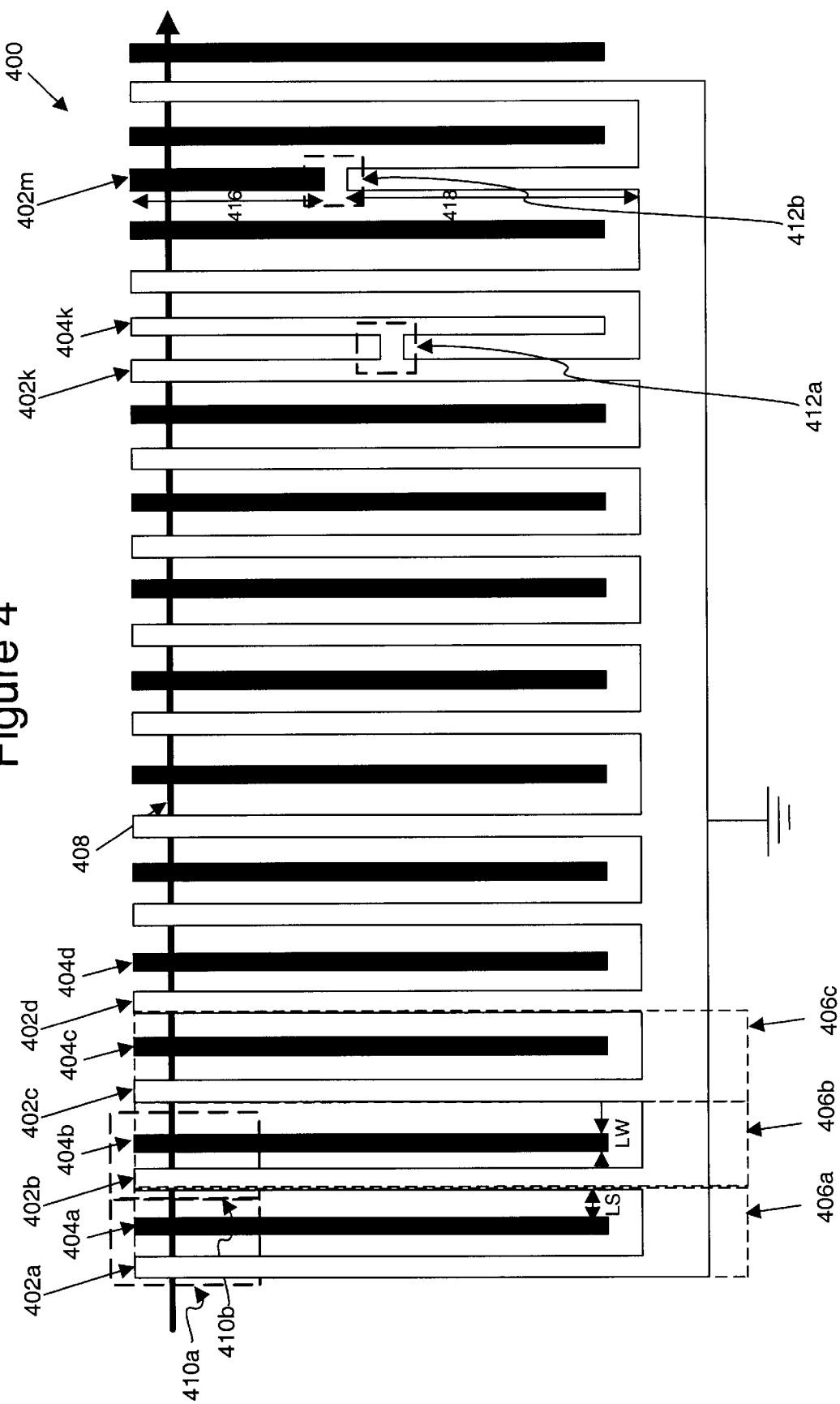

METHODS AND SYSTEMS FOR PREDICTING IC CHIP YIELD

CROSS-REFERENCE TO RELATED APPLICATION

This application takes priority under U.S.C. 119(e) of (1) U.S. Provisional Application No. 60/338,348 by Akella V.S Satya and Vladmir D. Federov, filed Dec. 5, 2001, entitled "K-T CRITICAL-AREA ALGORITHMS AND SW" and (2) U.S. Provisional Application No. 60/346,074 by Akella V. S Satya et al., filed Oct. 25, 2001, entitled "FULL-FLOW INTEGRATED-IC YIELD AND RELIABILITY TEST SITE." These applications are incorporated herein by reference in their entirety for all purposes.

BACKGROUND OF THE INVENTION

This invention relates to methods and apparatus for detecting defect densities in a semiconductor integrated circuit product and/or test structure to thereby predict product-limited yields and the product lot yields. More particularly, it relates to mechanisms for prediction of the end-of-line product wafer test yield from the in-line testing and/or inspection database at high confidence levels.

Conventionally, the test structures on a test wafer or product wafer are inspected or tested for defects, more specifically for electrical fails. The resulting defect sample may then be used to predict the product-chip yield in a product wafer lot. The test structures may be inspected using either optical inspection or scanning electron microscope tools. In an optical inspection, a beam of light is directed towards the test structures and the scattered light is then analyzed to determine whether defects are present within the test structures.

Another type of inspection is referred to as a voltage contrast inspection, using a scanning electron microscope. The voltage contrast technique operates on the basis that potential differences in the various conductive shapes of a sample under examination cause differences in, typically, the secondary and/or backscattered electron emission intensities when the sample is the target of a low-energy and high-current electron beam. The potential state of the scanned area is acquired as a voltage contrast image such that a low potential portion of, for example, a wiring pattern might be displayed as bright (intensity of the secondary electron emission is high) and a high potential portion might be displayed as dark (lower intensity secondary electron emission). Alternatively, the system may be configured such that a low potential portion might be displayed as dark and a high potential portion might be displayed as bright.

An electron detector is used to measure the intensity of the secondary and/or backscattered electron emission that originates from the path swept by the scanning electron beam. Images may then be generated from these electron emissions. A defective portion can be identified from the unintended potential state or appearance of the portion under inspection. The test structure portion under inspection is typically designed to produce a particular potential and resulting brightness level in an image during the voltage contrast inspection. Hence, when the scanned portion's potential and resulting image appearance differs significantly from the expected result, the scanned portion is classified as a defect.

Several inventive test structures designed by the present assignee are disclosed in U.S. Pat. No. 6,433,561 by Akella V.S. Satya et al., issued Aug. 13, 2002, which patent is incorporated herein by reference in its entirety. One test structure is designed to have alternating high and low potential conductive lines during a voltage contrast inspection. In one inspection application, the low potential lines are at ground potential, while the high potential lines are at a floating potential. However, if a line that is meant to remain floating shorts to an adjacent grounded line, both lines will then be at a low potential during a voltage contrast inspection. If there is an open defect present within a line that is designed to be coupled to ground, this open will cause a portion of the line to be left at a floating potential to thereby produce a high potential during the voltage contrast inspection. Both open and short defects cause two adjacent lines to have the same potential during the voltage inspection.

The results from inspecting the test structures, typically in a test chip, may then be used to predict product wafer-test yield of a product chip that is fabricated with the same process as the test chip. Such product wafer test yield is generally a product of the product-limited yields for all the primary defect mechanisms predicted from the corresponding test-structure yields. Unfortunately, product wafer test yield is typically only predicted after all processes, which contribute to all of the primary defect mechanisms, are performed. For example, the processes for each of the conductive interconnect layers and their individual test structures are completed so that the test structure yields from each interconnect layer may be obtained from each interconnect layer. The resulting test structure yields may then be combined appropriately to predict the product chip yield. Thus, predicted product wafer test yield excursions cannot be identified until a significant number of the processes are complete. The excursion may result in a significant loss of product at considerable expense. Additionally, since excursions are predicted rather late in the fabrication flow, one misses an opportunity to dynamically correct process errors early during the fabrication process.

Accordingly, there is a need for improved techniques for managing yield of integrated circuit (IC) wafers or modules. Additionally, there is a need to identify yield excursions early in the fabrication process.

SUMMARY OF THE INVENTION

Accordingly, techniques and systems for efficiently managing yield are provided. In general terms, as each wafer lot moves through fabrication, yield information is obtained from each set of test structures for a particular process or defect mechanism. The nature of the yield information is such that it may be used directly or indirectly to predict product wafer test yield. In one implementation, the yield information (e.g. components) includes a systematic yield ($Y_o$), a defect density (DD), and a defect clustering factor ($\alpha$) determined based on the inspected test structure's yield. A running average of the yield information for each process or defect mechanism is maintained as each wafer lot is processed. As a particular wafer lot moves through the various processes, a product wafer test yield may be predicted at any stage in the fabrication process based on the average yield information maintained for previously fabricated wafer lots.

In one embodiment, a method of managing and predicting product yield for a plurality of semiconductor products is disclosed. In one implementation, the semiconductor product is a product wafer lot and the predicted product yield is a predicted product wafer test yield. After a first process is performed on the semiconductor product, one or more test structures for the first process are inspected to obtain yield information related to a test structure yield for the first process. In one example, the yield information includes systematic yield, a defect density, and possibly a defect cluster factor α. A product yield of the semiconductor product at a time of fabrication completion is then predicted. The prediction is dynamically based on the obtained yield information for the first (e.g., current) process and an average of yield information for any remaining process(es) for the semiconductor product obtained from previously fabricated semiconductor products.

In a further aspect, the method includes (a) determining whether an excursion has occurred based on the predicted product yield; (b) when it is determined that an excursion has occurred, executing an excursion plan; and (c) when it is determined that an excursion has not occurred, performing a next process on the semiconductor product. In yet a further implementation, the method includes (d) after the next process is performed on the semiconductor product, inspecting one or more test structures for the next process to obtain yield information related to a test structure yield for the next process; and (e) predicting the product yield of the semiconductor product at a time of fabrication completion for the semiconductor product. The prediction is dynamically based on the obtained yield information for the first and next process for the semiconductor product and an average of yield information for any remaining process(es) for the semiconductor product from previously fabricated semiconductor products.

In another aspect, operations (a) through (e) are repeated until a final process for the semiconductor product is completed. After the final process for the semiconductor product has completed, an actual final test yield is then obtained on the semiconductor product. After each process for the semiconductor product completes, an average of the yield information is also updated for the each process. In one embodiment, this update is accomplished after the final process for the semiconductor product has completed.

In another aspect, the invention pertains to a computer program product for managing and predicting product yield for a plurality of semiconductor products. The computer program product includes at least one computer readable medium and computer program instructions stored within the at least one computer readable product configured to perform one or more of the above described methods. In another embodiment, the invention pertains to yield management system for managing and predicting product yield for a plurality of semiconductor products. The system includes at least one of processor and memory adapted to perform one or more of the above described methods.

These and other features and advantages of the present invention will be presented in more detail in the following specification of the invention and the accompanying figures which illustrate by way of example the principles of the invention.

BRIEF DESCRIPTION OF THE DRAWINGS

FIG. 4 is a diagrammatic top view representation of an example voltage contrast test structure having a short and open type fault defect.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
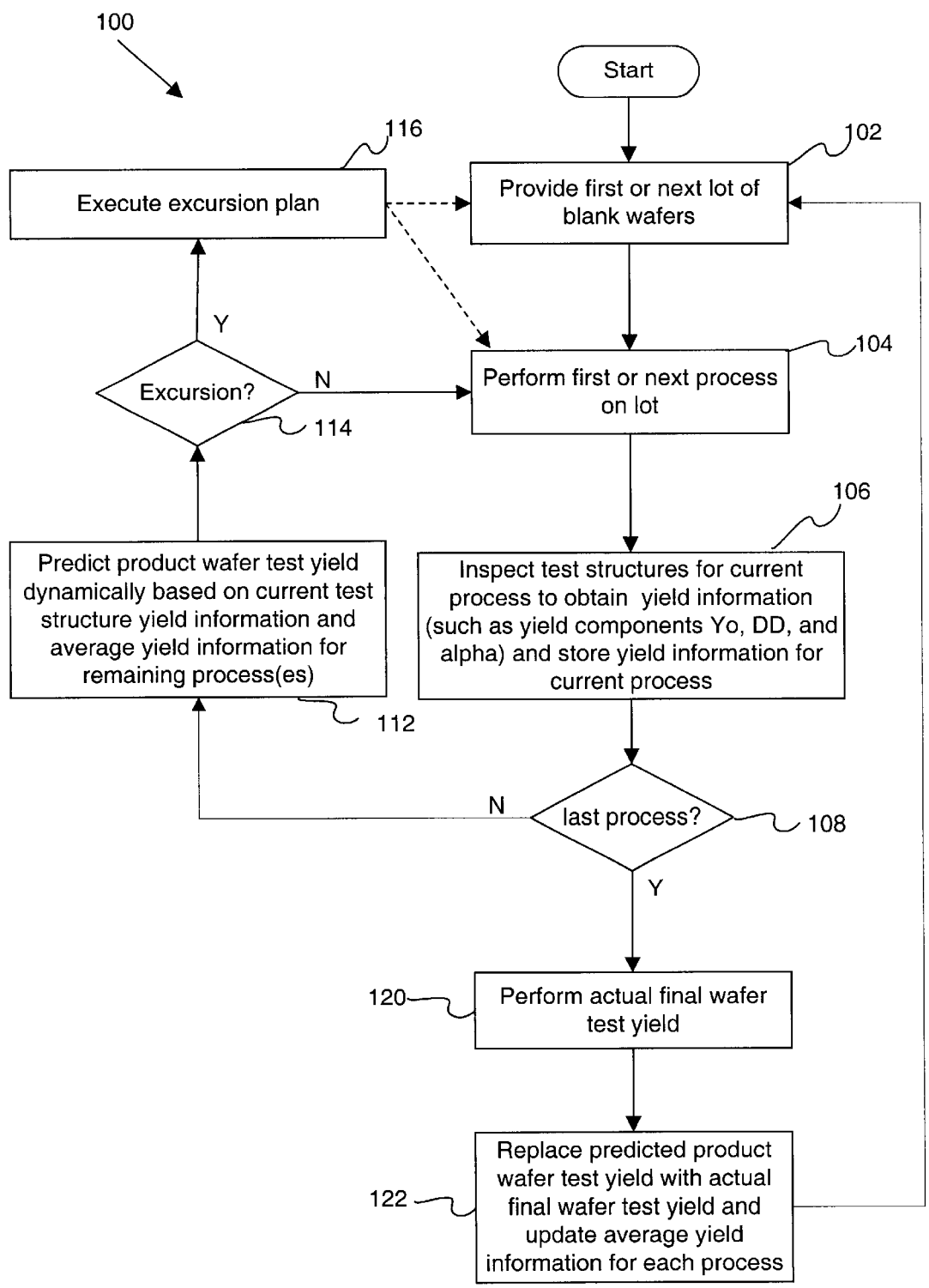
FIG. 1 is a flowchart illustrating a procedure for managing and predicting product yield in accordance with one embodiment of the present invention.

FIG. 1 is a flowchart illustrating a procedure 100 for managing and predicting product yield in accordance with one embodiment of the present invention. Initially, a first lot of blank wafers are provided in operation 102. A first process is then performed on the blank wafer lot in operation 104. This first process may include any suitable number and type of fabrication steps which are performed prior to an inspection procedure for a particular defect mechanism, such as electrical shorts or opens. For example, a first conductive interconnect layer, such as metal1, may be fabricated. In this example, a set of fabrication steps for a particular process may generally include formation of transistor devices, an dielectric layer with vias, and a metal1 conductive layer.

One or more test structures for the current process are then inspected to obtain yield information (such as systematic yield $Y_o$, defect density DD, and a defect clustering factor α) and to store the obtained yield information for the current process in operation 106. This stored yield information may later be used to keep a running average of yield parameters for each process as each wafer lot completes processing. Alternatively, the test structure yield as a function of test structure size may be stored and used later to keep a running average of test structure yield for the current process, which may be then be used to extract average yield information (e.g., components) for such process.

Figure 2:
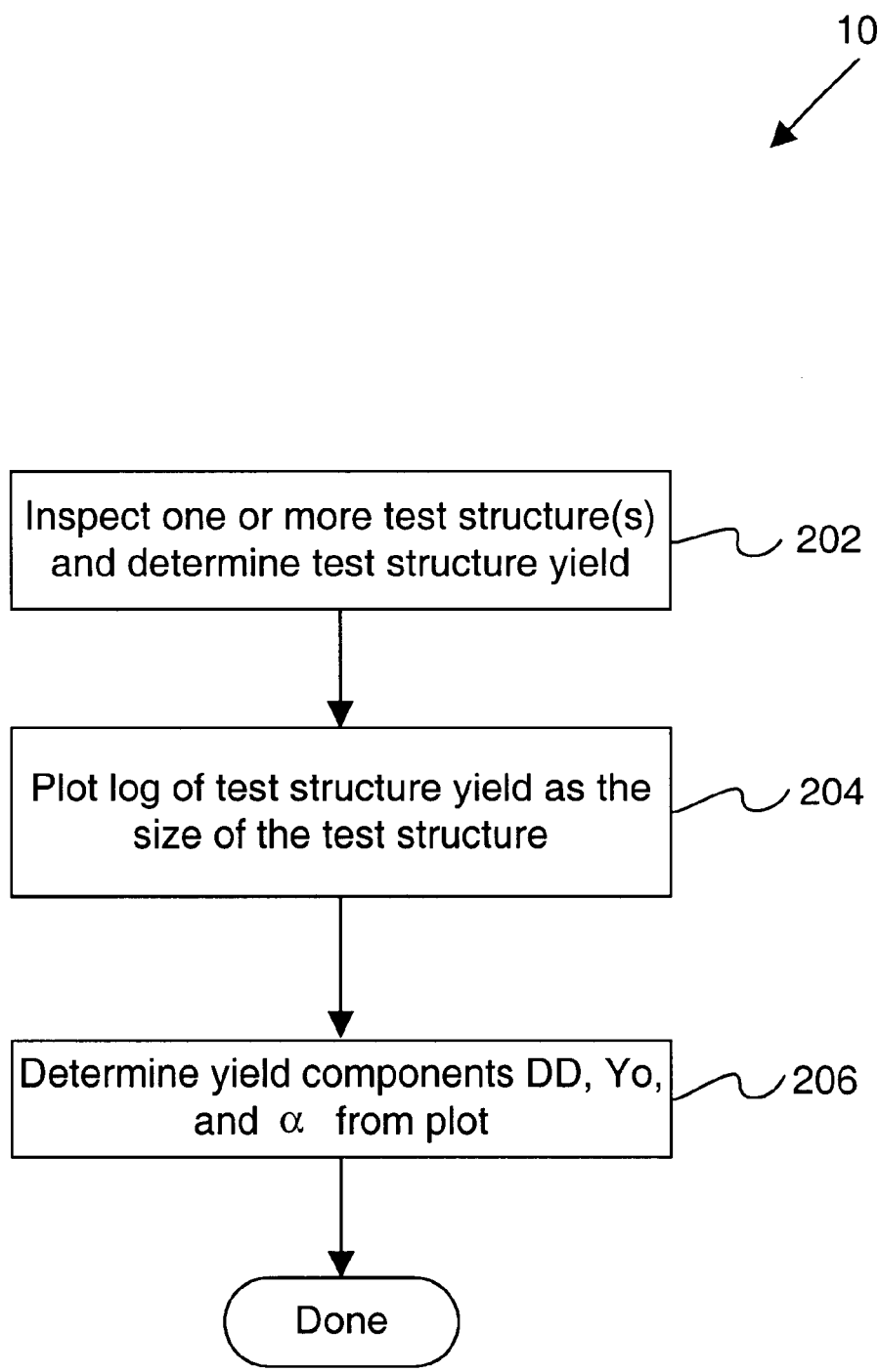
FIG. 2 is a flowchart illustrating the operation of FIG. 1 of inspecting one or more test structures in accordance with one embodiment of the present invention

FIG. 2 is a flowchart illustrating the operation 106 of FIG. 1 of inspecting one or more test structures for the current process to obtain and store yield information for the current process in accordance with one embodiment of the present invention. Initially, one or more test structures are inspected to determine test structure yield in operation 202. Any suitable number and type of test structures may be inspected to extract yield information or components for predicting product yield for a particular defect type, such as shorts or opens. Optical and e-beam inspection tools such as the KLA Tencor 21xx and ES20 available from KLA-Tencor of San Jose, Calif. can be used to inspect both physical and electrical defects using, for example, voltage contrast type test structures. Several example voltage contrast test structures are described in U.S. Pat. No. 6,433,561, issued Aug. 13, 2002, which patent is incorporated herein by reference in its entirety.

Figure 3:
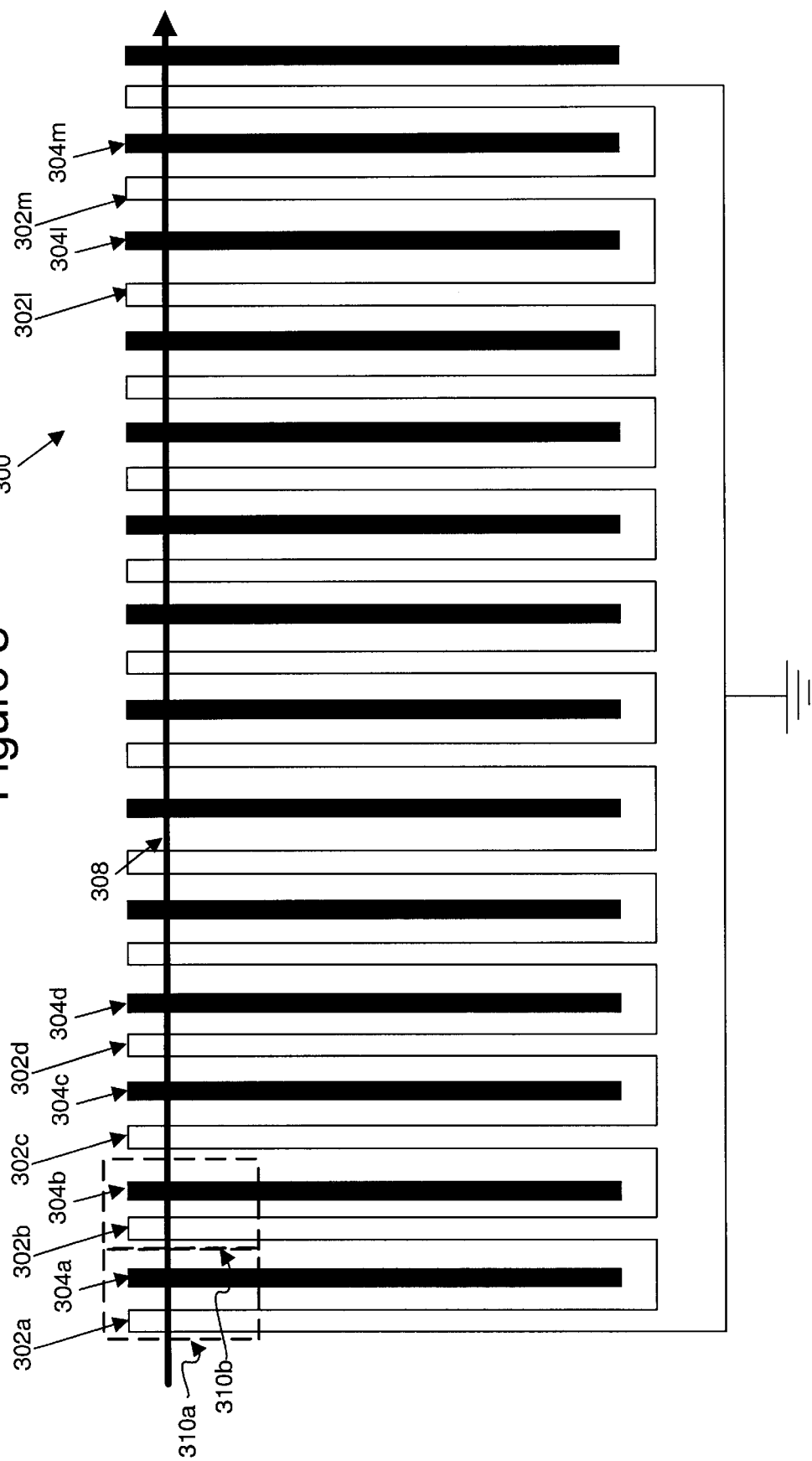
FIG. 3 is a diagrammatic top view representation of an example voltage contrast test structure having no fault defects.

FIG. 3 is a diagrammatic top view representation of an example voltage contrast test structure 300 having no faults. Test structure 300 is referred to as a comb-like structure. The inspection technique described below may be performed on a plurality of test structures similar to the test structure 300 of FIG. 3. Typically, a plurality of test structures for a plurality of processes are inspected on a product wafer to thereby predict the product yield.

In the illustrated embodiment, the test structure 300 includes a plurality of grounded conductive lines 302 and a plurality of floating conductive line 304. Voltage contrast images of a top portion of the conductive lines 302 and 304 are generated as an electron beam moves in direction 308. Each image (e.g., 310a and 310b) is referred herein to as an "image cell."

Preferably, the image cells correspond to feature portions that are designed to result in substantially identical images when no defects are present. In one embodiment, an image cell is generated for a top portion of each pair of grounded and floating lines. However, other portions of the features (e.g., a middle portion of the conductive lines) may be scanned. As shown, when the conductive lines are scanned in direction 308, cell 310a is first obtained and then cell 310b is obtained. Since the test structure 300 is expected to have alternating lines of grounded and floating potential, each image cell is expected to contain a bright line and a dark line. For example, the grounded lines 302 will appear bright, while the floating lines 304 will appear dark. Of course, the inspection tool may be set up so that the grounded lines 302 appear dark and the floating lines 304 appear bright. The specific intensity values of the conductive lines as the electron beam scans across them may also be ascertained to determine defects. When there are no defects, the intensity values are expected to include alternating high and low intensity values.

FIG. 4 is a diagrammatic top view representation of a test structure 400 having defects. As shown, there is an electrical short 412a between line 402k and 404k. This short 412a causes both lines 402k and 404k to appear bright. Another type of electrical defect that may occur in a test structure 400 is an open. As shown, there is an open defect 412b in line 402m. An open defect causes a portion 416 of line 402m to have a floating potential. Accordingly, the floating portion 416 will appear dark, while the portion of the line that remains coupled to ground (418) will have a bright appearance.

In sum, when two lines are shorted together, both lines will appear bright when scanned in direction 408. In contrast, when a line that is designed to be grounded contains an open, the top portion 416 of such line has the same dark appearance as its neighboring floating conductive lines when scanned in direction 408. Accordingly, when the electron beam moves in direction 408, a defect may be found when a particular cell is subtracted from another cell. For example, cell 410b may be subtracted from cell 410a. If the particular cell does not have a defect, this subtraction will ideally produce a substantially zero difference results. In contrast, when the particular cell has a defect, this subtraction will produce a significant difference that is then classified as defect. Electron beam tool parameter settings determine the percentage difference between the two cells that will be classified as a defect. The parameter settings may be experimentally determined and adjusted, for example, on a sample having a known number of defects.

The test structure may contain electrical defects, as well as physical defects. The physical defects may take any form, such as bumps along the edge of the line, indentations along the edge of the line, or holes within the center of the line. Preferably, mechanisms for filtering physical defects from electrical defects are also provided. Several techniques for filtering physical defects from electrical defects are described in co-pending U.S. application Ser. No. 10/000, 114 filed on Oct. 30, 2001, entitled APPARATUS AND METHODS RELIABLE AND EFFICIENT DETECTION OF VOLTAGE CONTRAST DEFECTS, by Weiner et al., which application is incorporated herein by reference in its entirety.

Other types of test structures may be utilized, besides the test structure illustrated in FIGS. 3 and 4. Preferably, some of the test structures have characteristics that affect random yield as the test structures illustrated in FIGS. 3 and 4, while other test structures have characteristics that affect systematic yield. The above illustrated test structures work well for predicting random type yield. Other types of test structures work better for systematic type yield prediction (process margin or pattern related failures), and such test structure types are well known to those skilled in the art. By way of example, pairs of adjacent short and long conductive lines may be used as the unit cell, which has a higher probability of failures than a pair of equally long conductive lines configured at the same design rules. By way of another example, each cell may include a straight line and a bent line. In another example, each cell may have a different via density. Finally, a cell may include a long line over a via and a short line over a via.

Figure 6:
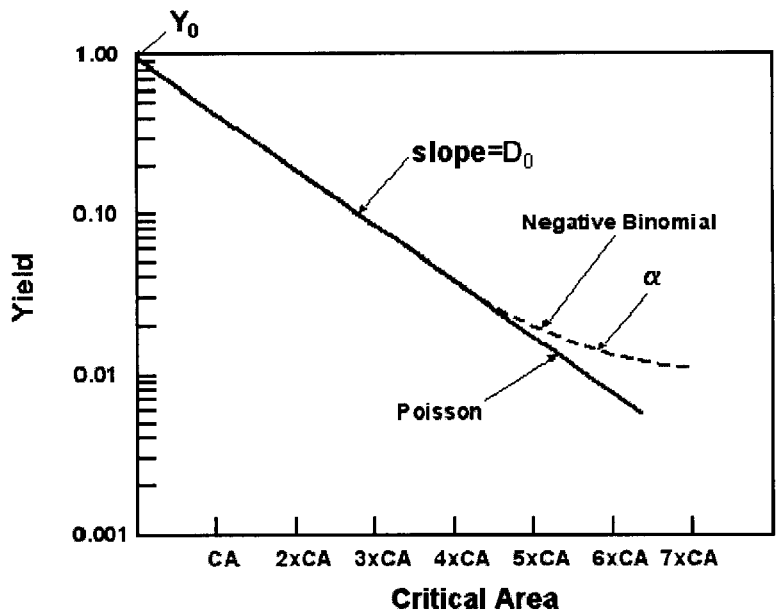
FIG. 6 is an illustration of a window-like analysis technique for extracting yield parameters from the test structure yield.

After the one or more test structures for the current process are inspected, a log of the inspected test structure(s) yield is then plotted as a function of the size of the test structure(s) in operation 204 as shown in FIG. 6, for example. The yield components may then determined from the test structure yield plot (or calculated directly from the yield data as a function of test structure size without plotting the test structures yield function) in operation 206. By plotting test structure yield vs. size (or multiples of critical area), the yield information or components can be extracted using a non-linear regression analysis, which is referred herein as a "window-like analysis." In the window-like analysis, the wafer (or die) is partitioned into equal areas called windows. The number of defects per window is counted, and the resulting yield is plotted against critical areas (FIG. 6).

$$\ln Y = \ln Y_0 - \alpha \ln(1 + D_0 * CA/\alpha)$$

Yield models are empirical in nature and depend heavily on the nature of the defects database. For random distributed defects, the yield can be described by a Poisson function:

$$Y = Y_0 e - \lambda \qquad [1]$$

where $Y_0$ is the systematic yield component, which is independent of the test structure area, and $\lambda$ is the faults per chip. The faults per chip ($\lambda$) is formulated as a function of critical area CA and defect density $D_0$ (also referred herein as DD).

$$\lambda = CA * D_0 \qquad [2]$$

The Poisson yield model is derived from the binomial distribution. This model assumes no defect has any effect on any other defect, and ignores non-uniformity in defect density $D_0$. While the use of the Poisson model assumes defects have an equal probability of appearing on any die.

For clustered defects, yield can be described by negative Binomial function:

$$Y = Y_0 (1 + \lambda/\alpha)^{-\alpha} \quad [3]$$

where $\alpha$ is the cluster factor: $\alpha = (\mu/\sigma)^2$, where $\mu$ is the mean and $\sigma$ is the standard deviation of the defect density.

The systematic yield component $Y_0$ may be determined from the intercept and the defect density $D_0$ may be determined from the slope of the lnY vs. critical area curve of FIG. 6. Unlike the Poisson yield model, which assumes an uniformly random defect distribution, the Negative Binomial model takes account of defect clustering. The curvature that deviates from a straight line in the lnY vs. critical area plot represents the clustering factor $\alpha$.

Figure 5A:
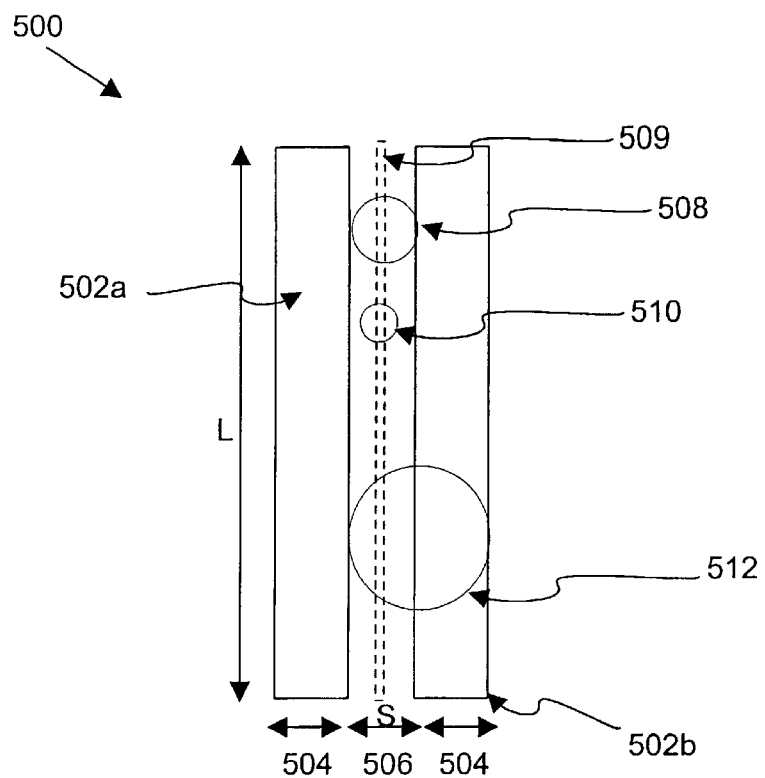
FIG. 5A is a diagrammatic top view of a simple test structure having two conductive lines.
Figure 5B:
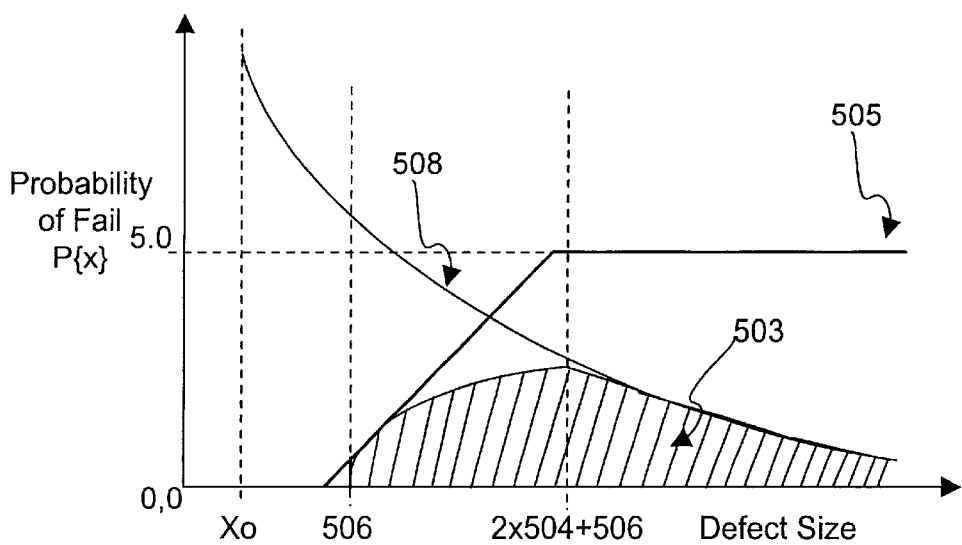
FIG. 5B is a graph of the Probability of Fail, the Defect Size Distribution function, and the critical area as a function of defect size for the test structure of FIG. 5A.

Any suitable technique may be implemented for determining the probability of fail and the critical area which may then be used to predict product wafer test yield. Several techniques are described further below. Critical area refers to the fractional area of the layout, in which if a defect occurs, it would cause a fault (e.g., an electrical fail due to a short or an open). FIGS. 5A and 5B illustrate the concept of critical area. Each specific configuration of semiconductor circuit, pattern, and test structure has an associated critical area. Additionally, each specific circuit, pattern, and test structure has an associated Probability of Fail curve as a function of defect size. FIG. 5A is a diagrammatic top view of a simple test structure 500 having two conductive lines 502a and 502b. The lines 502a and 502b both have a width 504 and a spacing 506.

FIG. 5B is a graph showing the critical area 503, the probability of fail 505 and the defect-size distribution 507 [normalized to unity between $X_0$ and $\infty$] as a function of defect size for the test structure 500 of FIG. 5A. A defect 510 that has a size less than the line spacing will not cause a fault (e.g., short) in any area of test structure 500. As shown in FIG. 5B, the probability of fail is zero for defects of sizes less than the line spacing 506. However, a defect 508 or defect 412 having a size (e.g., diameter) equal to or greater than the width 506 will have an associated probability for causing a fault. For example, if the center of the defect 508 is positioned in a narrow area 509 that runs down the centerline between the two lines 502, it will cause a fault by shorting the two lines 502.

The ratio of this narrow area 509 and the area of the window 500 is the probability of fail for defect 508 having a size about equal to the spacing 506. The probability of fail will continue to increase for increasingly sized defects until it equals unity at a particular defect size. For this test structure 500, the plateau at unity occurs at a defect size that is twice the space 506 plus the line width 504. When this probability of fail curve 505 is convoluted with the defect-size distribution 507 and the result is integrated between the limits of $X_0$ and Xmax, a reasonably large maximum defect size much greater than [(2*506)+(504)], the critical area may be obtained.

Referring back to FIG. 1, after the one or more test structures for the current process are inspected, it is then determined whether this is the last process in operation 108. In other words, it is determined whether fabrication is complete for the wafer lot. If this is not the last process, a product wafer test yield may then be dynamically predicted based on the current test structure yield information and the average yield information for the remaining one or more process(es) in operation 112. For example, yield for each process may be calculated with the above Poison or Binomial function (equations 1 or 3, respectively) based on the extracted yield components for the current process, yield components for previous process(es) performed on the current wafer lot, and/or average yield components for the remaining process(es) obtained from previous wafer lots. That is, the yield components for each process are plugged into either the Poison or Binomial yield function, along with the critical area for the product. Each determined yield for each process may then be multiplied together to thereby determine the predicted product wafer test yield Additionally, the average yield information (e.g., yield components) for the current process for the total fabricated wafer lots and the current wafer lot may be determined after each set of test structures for each process are inspected. For example, the current wafer lot may only have obtained yield information for the metal1 process and not the metal2 or metal3 process. The yield information for the metal1 process obtained from the current wafer lot are then averaged together with yield information for the metal1 process previously obtained from earlier wafer lots. In this embodiment, the operation 122 where yield information for each process are updated after final wafer test is unnecessary.

After the product wafer test yield is predicted, it is then determined whether an excursion has occurred in operation 114. In one implementation, it is determined whether the predicted product wafer test yield has deviated significantly from the average predicted product wafer test yield obtained from previously fabricated lots or from a process for the same lot. In one implementation, when the predicted product wafer test yield deviates more than three standard deviations from an average predicted product wafer test yield or an average actual product wafer test yield, it is determined that an excursion has occurred.

If an excursion has occurred, an excursion plan may be executed in operation 116. The wafer lot may be reworked if possible, and the next process is then performed in operation 104. For instance, a wafer lot may be reworked by stripping the current photo-resist and reapplying a new coat. Alternatively, the wafer lot may be scrapped, and a next blank wafer lot is provided in operation 102. In other implementations, the process conditions may be adjusted for the current and/or next process, and the next process is then performed in operation 104. The process conditions may include changing any adjustable process parameters which affect a particular process, such as exposure-dose of a photolithography process, a focus of a photolithography process. If an excursion has not occurred, the next process is then performed on the wafer lot in operation 104. Test structures are then again inspected for the current process in operation 106. The yield information for each process are then determined from the inspected test structures for each process as each process is completed. A product wafer test yield may then be again predicted based on the actual yield information from the completed processes, as well as the average yield information from the previously tested lots for the remaining processes.

When the last process is completed, a final wafer test yield is performed in operation 120. The predicted product wafer test yield is then replaced with the final wafer test yields and the average yield information (e.g., yield components) for each process are then updated based on the final wafer test yield. These average yield information (e.g., yield components) may then be used for later wafer lots to predict yield when all of the wafer lot's processes have not completed, for example, in operation 112.

Figure 7:
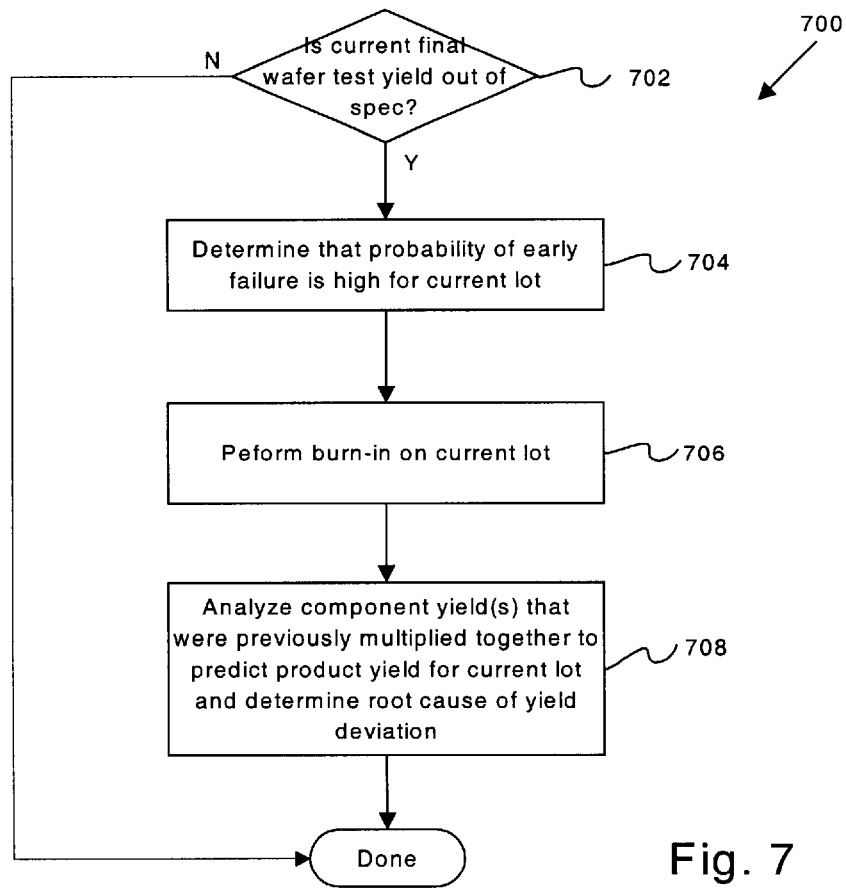
FIG. 7 is a flowchart illustrating a procedure for utilizing the final wafer test yield in accordance with one embodiment of the present invention.

The final wafer test yield for a particular wafer lot may be utilized in any suitable manner. FIG. 7 is a flowchart illustrating a procedure 700 for utilizing the final wafer test yield in accordance with one embodiment of the present invention. Initially, it is determined whether the current final test yield is out of specification in operation 702. In one implementation, it is determined whether the current final wafer test yield significantly differs from other wafer lot's final wafer test yield. In a specific example, it is determined whether the current final wafer test yield differs more than three standard deviations from an average final wafer test yield obtained from the total processed wafer lots.

If the current final wafer test yield is not out of specification, the procedure 700 ends. If the current final wafer test yield is out of specification, it may then be determined that the probability of early failure is high for the current lot in operation 704. A burn-in procedure may then be performed on the current lot in operation 706. Otherwise, the burn-in procedure may be skipped when the current final test yield is within specification. Several techniques for determining whether to perform burn-in are described in concurrently filed U.S. patent application Ser. No. 10/281,432, by Akella V.S. Satya et al. entitled "APPARATUS AND METHODS FOR MANAGING RELIABILITY OF SEMICONDUCTOR DEVICES", which application is incorporated herein by reference in its entirety for all purposes. The techniques described in this concurrently filed application may be combined with techniques described here to determine whether to perform burn-in.

Additionally, the yield components that were used to predict product yield for the current lot may be analyzed to determine root cause of the yield deviation in operation 708. For instance, it may be determined whether the yield components for a particular process for the current wafer lot differs more than three standard deviations from the average yield components for such process. The deviating process may then be defined as the root cause of the low final wafer test yield. The real-time defectivity-monitoring is also helpful in prioritizing the yield-detractors and judicial allocation of resources to recover the entitled product yield.

Techniques for determining the probability of fail function and a resulting critical area of a particular test structure or product layout will now be described. (The critical area for the inspected test structures and the wafer product may be used as described above to predict product wafer test yield). One technique implements a closed-form solution for the determining the probability of fail curve for conductive line structures each having a width W, and separated by a distance S: The probability of fail for shorts in this simple layout is:

$$P\{X\}=0 \text{ for } X \leq (506)$$

$$P\{X\} = \frac{X-S}{W+S} \text{ for } (506) < X < [2*(506)+(504)], \text{ and}$$

$$P\{X\}=1 \text{ for } X \geq [2*(506)+(504)];$$

and the Critical Area is:

$$CA = \int_{X_0}^{X_{max}} P\{X\} \cdot DSD \cdot dX$$

$$= (p-1)^{(p-1)} * X_0 \left[ \int_{X_0}^{2*S+W} \left( \frac{X-S}{W+S} \right) * \left( \frac{1}{X^p} \right) dX + \int_{2*S+W}^{X_{max}} \frac{1}{X^p} dX \right]$$

However, this closed-form solution is only valid for parallel lines of one constant width and spacing, which is neither typical in any product, nor in a usual test structure layout.

One conventional technique for determining critical area is referred to as the "Quasi-Monte Carlo simulation." In this technique, random defects are simulated as being superimposed on a particular design data. These simulated defects initially have a particular diameter x. The number of faults produced by these defects having an initial diameter x is then determined. Defects having a diameter equal to x+Δx are then simulated on the design data. The number of faults is then determined for defects having the diameter x+Δx. This simulation process iteratively repeats for larger sized defects until a maximum defect size of $X_{max}$ is reached. The probability of fail can then be determined from the number of faults and the total number of defects simulated at each incremental Δx step. This iterative process is very time consuming, even for one defect mechanism (such as opens or shorts).

In another technique, each design structure is incrementally expanded until a short fault occurs when the two structures short together. The distance that the structure expanded is equal to the radius of the defect that can cause a fault. Similarly, for the case of the opens, the shapes are contracted by Δx iteratively for determining the probability of fail curve [until $X_{max}$.] Although these techniques all succeed in determining critical area for a particular structure type, these conventional simulation techniques are each very time consuming and utilize a significant amount of processor and memory resources. Other techniques perform a simulation on "sample" portions of the design data, rather than the entire design data. One example of a critical area determination software tool is EYES developed at the University of Edinburgh, England. However, this technique may produce inaccurate determinations of the critical areas, if the simulation sampling does not include representative portions of the critical design regions of the design.

The critical area of a particular layout or test structure may be calculated directly from the layout features themselves. Several techniques for determining critical area directly from the layout dimensions without iteratively changing the feature sizes or defect sizes are described further in concurrently filed U.S. Patent Application, having application Ser. No. 10/281,416, by Akella V.S. Satya et al., entitled APPARATUS AND METHODS FOR DETERMINING CRITICAL AREA OF SEMICONDUCTOR DESIGN DATA, which application is incorporated herein by reference in its entirety. In one embodiment, a particular semiconductor design layout having a plurality of features is first provided. The features have a plurality of polygon shapes which include nonrectangular polygon shapes. Each feature shape has at least one attribute or artifact, such as a vertex or edge. A probability of fail function is calculated based on at least a distance between two feature shape attributes or artifacts. By way of example implementations, a distance between two neighboring feature edges (or vertices) or a distance between two feature edges (or vertices) of the same feature is first determined and then used to calculate the probability of fail function. In a specific aspect, the distances are first used to determine midlines between neighboring features or midlines within a same feature shape, and the midlines are then used to determine the probability of fail function. A critical area of the design layout is then determined based on the determined probability of fail function. In specific implementations, the defect type is a short type defect or an open type defect. In a preferred implementation, the features may have any suitable polygonal shape, as is typical in a design layout.

In a specific implementation, the particular defect type is a short type defect and calculating the probability of fail function includes (1) dividing the layout into a plurality of points; (2) for each point, determining a first and a second nearest features, (3) for each point, calculating a first shortest distance to the first nearest feature, (4) for each point, calculating a second shortest distance to the second nearest feature, (5) for each point, defining the second shortest distance as a critical radius; and (6) determining the probability of fail function based on the critical radius, where the probability of fail is equal to one for defects having a defect radius equal to or greater than the critical radius and is equal to zero for a defect radius less than the critical radius. A defect of such radius that falls at this point will touch both the first and second nearest neighboring shapes and cause a fault (a short in this case).

In another implementation, the particular defect type is an open type defect and calculating the probability of fail function includes (1) dividing the layout into a plurality of points; (2) for each point, determining a plurality of pairs of first and second nearest opposite edges, (3) for each point, determining one or more pairs of first and second inside opposite corners when there are one or more inside corners present within a feature associated with the each point, (4) for each point and each pair of first and second opposite edges, calculating a first shortest distance to the first nearest edge and calculating a second shortest distance to the second nearest edge, (5) for each point and each pair of inside corners, calculating a first shortest distance to the first nearest inside corner and calculating a second shortest distance to the second nearest inside corner, (4) for each point, defining a minimum of the plurality of second shortest distances as the critical radius; and (5) determining the probability of fail function based on the critical radius, where the probability of fail is equal to one for defects having a defect radius equal to or greater than the critical radius and is equal to zero for a defect radius less than the critical radius.

In yet another embodiment, calculating the probability of fail function includes the following operations: (1) for each vertex of a feature, determining and adding a midpoint of a line from such feature to a closest feature to a midpoint list; if the particular defect type is a open type defect, for each feature of the layout, determining a critical boundary midway between the longest distanced opposite edges or the inside corners of the feature (2) merging the midpoint list into a plurality of critical boundaries for shorts and for opens, called external boundaries (3) for each point of the external boundary, determining and adding a midpoint of a line from such feature to the closest feature of a different external boundary, to a midpoint list, (4) merging the midpoint list into a plurality of critical boundaries, termed internal boundaries. The intersection of the internal and external boundaries defines regions with uniform critical radius gradient. The probability of fail curve can be found from the value of the gradient function by calculating the area between the internal boundary and the external boundary.

Generally, the techniques of the present invention for managing yield may be implemented on software and/or hardware. For example, these techniques can be implemented in an operating system kernel, in a separate user process, in a library package bound into inspection applications, or on a specially constructed machine, such as an optical or scanning electron microscopy inspection system available from KLA-Tencor of San Jose, Calif. In a specific embodiment of this invention, some of the techniques of the present invention are implemented in software such as an operating system or in an application running on an operating system. A software or software/hardware hybrid yield management system of this invention may be implemented on a general-purpose programmable machine selectively activated or reconfigured by a computer program stored in memory.

Figure 8:
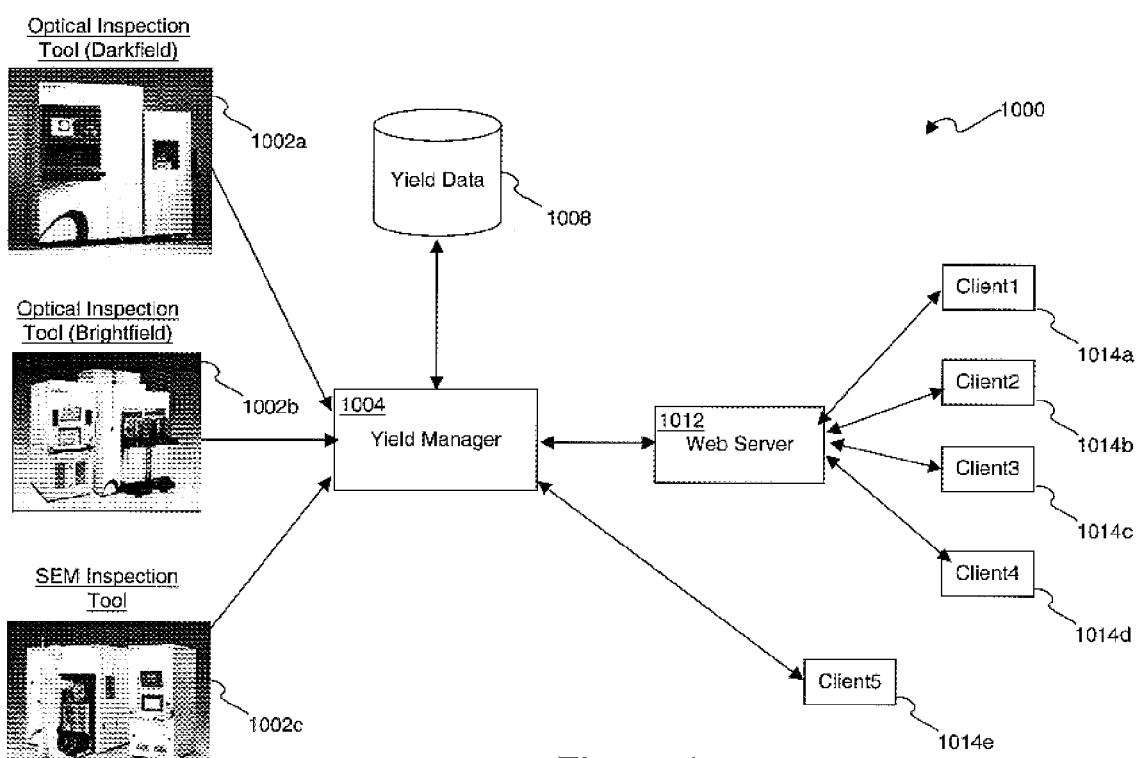
FIG. 8 is a diagrammatic representation of a yield management system in accordance with one embodiment of the present invention.

FIG. 8 is a diagrammatic representation of a yield management system 1000 in accordance with one embodiment of the present invention. As shown, the system 1000 includes a plurality of inspection systems 1002. Each inspection system is configured to output defect/fault information or test structure yield information to yield management system 1004. In one embodiment, each inspection tool 1002 may be configured to inspect one or more test structures for a particular process and obtain test structure yield. Each inspection tool may also be configured to extract yield information, such as $Y_0$, DD, and $\alpha$ from the test structure yield data. Alternatively, the yield manager 1004 may be configured to extract such yield information based on received test structure yield information. The defect/fault and/or yield information may be stored in database 1008 by each inspection tool 1002 and/or by the yield manager 1004. The yield manager may also be configured to predict product wafer test yield based on yield information obtained from one or more inspection tools 1002 and/or stored in database 1008.

The inspection systems may include any suitable inspection or review tool that is capable of inspecting one or more test structures to determine test structure yield and yield parameter analysis. By way of examples, the inspection tools 1002 may include an optical tool, such as a darkfield mode optical inspection tool 1002a, a brightfield optical inspection tool, and/or a scanning electron microscopy tool, in addition to the critical-dimension monitoring metrology, or electrical critical parameter testing, all of which can impact the product yield. In the illustrated embodiment, the yield manager 1004 is configured to implement the above described techniques of the present invention. However, the techniques of the present invention may be implemented in any number and type of data processing devices or inspection tools. That is, the techniques of the present invention may be implemented in any suitable combination of hardware and/or software.

Other useful information that may be associated with the yield information and may also be available to the yield manager 1004. For example, parametric information may be available in database 1008. Of course, this information may be combined with the other identifying information, such as a lot identifier and fabrication tool identifiers and current operating conditions, in database 1008. The identifying information may be used to determined a root cause for a yield deviation. The identifying information may be contained within a single database or distributed among a plurality of databases.

A plurality of clients 1014 may access the yield management queries through web server 1012. By way of examples, a yield management query may include requesting an average or current final wafer test yield, an average or current predicted product wafer test yield, the average or current yield information or components for a particular process, etc. Alternatively or additionally, a client (e.g., 1014e) may perform a yield management query through the yield manager 1004 without going through a web server. That is, the techniques performed by the yield manager 1004 may be accessed remotely or locally. Additionally, the system 1000 does not have to be web based. Each client may be configured so that a user may initiate a query and view the results of such query. Alternatively, a query may be automatically initiated by a software program or hardware tool. A client may be located in the same fabrication facility in which the yield manager and/or databases are located or in a different fabrication facility. In one application of the present invention, a user may wish to start up a particular fabrication facility and use a similar fabrication facility's database of yield information until their own database is built up.

Yield manager 1004 and each inspection tool 1002 may each include a variety of processors, storage elements, and input and output devices. In one embodiment, the yield manager and each inspection tool includes a computer system having a processor and one or more memory devices.

Regardless of the yield manager's or inspection tool's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples, reference images, defect classification and position data, test structure characteristics (e.g., line width and spacing values), yield statistical data, yield parameters, predicted yield data, critical boundary information, critical area or radius values, and yield results, as well as values for particular operating parameters of the inspection system.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and flash memories (EEPROM) as well as write type memory such as random access memory (RAM). The invention may also be embodied in a carrier wave traveling over an appropriate medium such as airwaves, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of managing and predicting product yield for a plurality of semiconductor products, comprising:

after a first process is performed on a particular semiconductor product, inspecting one or more test structures for the first process to obtain yield information related to a test structure yield for the first process, wherein a subsequent process remains to be performed on the particular semiconductor product; and predicting a product yield of the semiconductor product at a time of fabrication completion, wherein the prediction is dynamically determined by combining the obtained yield information for the first process with at least an average of yield information obtained from a plurality of times for which the subsequent process was previously performed on a plurality of previously fabricated semiconductor products.

2. A method as recited in claim 1, wherein the semiconductor product is a product wafer lot and the predicted product yield is a predicted product wafer test yield.

3. A method as recited in claim 1, wherein the yield information includes a systematic yield and a defect density.

4. A method as recited in claim 1, wherein the yield information includes a systematic yield, a defect density, and a defect cluster factor $\alpha$.

5. A method as recited in claim 1, further comprising:
a) determining whether an excursion has occurred based on the predicted product yield;
b) when it is determined that an excursion has occurred, executing an excursion plan; and
c) when it is determined that an excursion has not occurred, performing a next process on the semiconductor product.

6. A method as recited in claim 5, further comprising:
d) after the next process is performed on the semiconductor product, inspecting one or more test structures for the next process to obtain yield information related to a test structure yield for the next process; and
e) predicting the product yield of the semiconductor product at a time of fabrication completion for the semiconductor product, wherein the prediction is dynamically based on the obtained yield information for the first and next process for the semiconductor product and an average of yield information for any remaining process(es) for the semiconductor product from previously fabricated semiconductor products.

7. A method as recited in claim 5, further comprising:
repeating operations (a) through (e) until a final process for the semiconductor product is completed;
after the final process for the semiconductor product has completed, performing an actual final test yield on the semiconductor product; and
after each process for the semiconductor product completes, updating an average of the yield information for the each process.

8. A method as recited in claim 7, wherein the update is accomplished after the final process for the semiconductor product has completed.

9. A method as recited in claim 7, wherein it is determined that an excursion has occurred when the predicted product yield differs by more than three standard deviations from an average predicted product yield for previously completed semiconductor products.

10. A method as recited in claim 7, wherein the excursion plan includes reworking the semiconductor product.

11. A method as recited in claim 7, wherein the excursion plan includes halting processing of the semiconductor product.

12. A method as recited in claim 7, wherein the excursion plan includes adjusting a process condition at the appropriate process step.

13. A method as recited in claim 1, wherein the one or more test structures are voltage contrast test structures which are designed for detection of systematic and random defects, such as electrical opens and shorts.

14. A method as recited in claim 13, wherein the inspection of the one or more test structures is accomplished with a scanning electron microscope or electron beam inspection tool.

15. A method as recited in claim 13, wherein the inspection of the one or more test structures is accomplished with an optical inspection tool.

16. A computer program product for managing and predicting product yield for a plurality of semiconductor products, the computer program product comprising:
at least one computer readable medium;
computer program instructions stored within the at least one computer readable product configured to:
after a first process is performed on a particular semiconductor product, receive yield information related to a test structure yield for the first process, wherein a subsequent process remains to be performed on the particular semiconductor product; and
predict a product yield of the semiconductor product at a time of fabrication completion, wherein the prediction is dynamically determined by combining the obtained yield information for the first process with at least an average of yield information obtained from a plurality of times for which the subsequent process was previously performed on a plurality of previously fabricated semiconductor products.

17. A computer program product as recited in claim 16, wherein the semiconductor product is a product wafer lot and the predicted product yield is a predicted product wafer test yield.

18. A computer program product as recited in claim 16, wherein the yield information includes a systematic yield and a defect density.

19. A computer program product as recited in claim 16, wherein the yield information includes a systematic yield, a defect density, and a defect cluster factor $\alpha$.

20. A computer program product as recited in claim 16, the computer program instructions stored within the at least one computer readable product being further configured to:
a) determine whether an excursion for the semiconductor product has occurred based on the predicted product yield;
b) when it is determined that an excursion for the semiconductor product has occurred, indicate that an excursion plan is to be executed; and
c) when it is determined that an excursion for the semiconductor product has not occurred, indicating that a next process on the semiconductor product is to be performed.

21. A computer program product as recited in claim 20, the computer program instructions stored within the at least one computer readable product being further configured to:
d) after the next process is performed on the semiconductor product, receive yield information related to a test structure yield for the next process; and
e) predict the product yield of the semiconductor product at a time of fabrication completion, wherein the prediction is dynamically based on the obtained yield information for the first and next process for the semiconductor product and an average of yield information for any remaining process(es) for the semiconductor product from previously fabricated semiconductor products.

22. A computer program product as recited in claim 20, the computer program instructions stored within the at least one computer readable product being further configured to:
repeat operations (a) through (e) until a final process is completed;
after each process for the semiconductor product completes, updating an average of the yield information for the each process.

23. A computer program product as recited in claim 22, wherein the update is accomplished after the final process for the semiconductor product has completed.

24. A computer program product as recited in claim 22, wherein it is determined that an excursion for the semiconductor product has occurred when the predicted product yield differs by more than three standard deviations from an average predicted product yield for previously completed semiconductor products.

25. A yield management system for managing and predicting product yield for a plurality of semiconductor products, the system comprising:
one or more processors;
one or more memory, wherein at least one of the processors and memory are adapted to:
after a first process is performed on a particular semiconductor product, receive yield information related to a test structure yield for the first process, wherein a subsequent process remains to be performed on the particular semiconductor product; and
predict a product yield of the semiconductor product at a time of fabrication completion, wherein the prediction is dynamically determined by combining the obtained yield information for the first process with at least an average of yield information obtained from a plurality of times for which the subsequent process was previously performed on a plurality of previously fabricated semiconductor products.

26. A yield management system as recited in claim 25, wherein the semiconductor product is a product wafer lot and the predicted product yield is a predicted product wafer test yield.

27. A yield management system as recited in claim 25, wherein the yield information includes a systematic yield and a defect density.

28. A yield management system as recited in claim 25, wherein the yield information includes a systematic yield, a defect density, and a defect cluster factor $\alpha$.

29. A yield management system as recited in claim 25, wherein the at least one of the processors and memory are further adapted to:
a) determine whether an excursion for the semiconductor product has occurred based on the predicted product yield;
b) when it is determined that an excursion for the semiconductor product has occurred, indicate that an excursion plan is to be executed; and
c) when it is determined that an excursion has not occurred, indicating that a next process on the semiconductor product is to be performed.

30. A yield management system as recited in claim 29, wherein the at least one of the processors and memory are further adapted to:
d) after the next process is performed on the semiconductor product, receive yield information related to a test structure yield for the next process; and e) predict the product yield of the semiconductor product at a time of fabrication completion, wherein the prediction is dynamically based on the obtained yield information for the first and next process for the semiconductor product and an average of yield information for any remaining process(es) for the semiconductor product from previously fabricated semiconductor products.

31. A yield management system as recited in claim 29, wherein the at least one of the processors and memory are further adapted to:

repeat operations (a) through (e) until a final process is completed;

after each process for the semiconductor product completes, updating an average of the yield information for the each process.

32. A yield management system as recited in claim 31, wherein the update is accomplished after the final process for the semiconductor product has completed.

33. A yield management system as recited in claim 31, wherein it is determined that an excursion for the semiconductor product has occurred when the predicted product yield differs by more than three standard deviations from an average predicted product yield for previously completed semiconductor products.

* * * * *